United States Patent
Xiao et al.

(10) Patent No.: US 11,424,221 B2
(45) Date of Patent: Aug. 23, 2022

(54) PAD STRUCTURES FOR SEMICONDUCTOR DEVICES

(71) Applicant: Yangtze Memory Technologies Co., Ltd., Hubei (CN)

(72) Inventors: Liang Xiao, Wuhan (CN); Shu Wu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/127,019

(22) Filed: Dec. 18, 2020

(65) Prior Publication Data

US 2022/0068882 A1 Mar. 3, 2022

Related U.S. Application Data

(63) Continuation of application No. PCT/CN2020/112978, filed on Sep. 2, 2020.

(51) Int. Cl.
*H01L 25/065* (2006.01)
*H01L 21/768* (2006.01)

(52) U.S. Cl.
CPC .... *H01L 25/0657* (2013.01); *H01L 21/76892* (2013.01); *H01L 21/76898* (2013.01)

(58) Field of Classification Search
CPC ........... H01L 25/0657; H01L 21/76892; H01L 21/76898
See application file for complete search history.

(56) References Cited

U.S. PATENT DOCUMENTS

| 10,283,493 | B1 * | 5/2019 | Nishida ............. H01L 27/11573 |
| 10,354,987 | B1 | 7/2019 | Mushiga et al. |
| 10,629,616 | B1 * | 4/2020 | Kai .................... H01L 27/1157 |
| 10,868,025 | B2 * | 12/2020 | Zhou ................. H01L 27/11524 |

(Continued)

FOREIGN PATENT DOCUMENTS

| CN | 111146202 A | 5/2020 |
| CN | 111566815 A | 8/2020 |
| TW | 201834152 A | 9/2018 |

OTHER PUBLICATIONS

International Search Report dated May 31, 2021 in PCT/CN2020/112978 filed Sep. 2, 2020, 5 pages.

*Primary Examiner* — Mamadou L Diallo
(74) *Attorney, Agent, or Firm* — Oblon, McClelland, Maier & Neustadt, L.L.P.

(57) ABSTRACT

Aspects of the disclosure provide a semiconductor device. The semiconductor device includes a first die and a second die boned face-to-face. The first die includes first transistors formed on a face side of the first die in a semiconductor portion and at least a contact structure disposed in an insulating portion outside the semiconductor portion. The second die includes a substrate and second transistors formed on a face side of the second die. Further, the semiconductor device includes a first pad structure disposed on a back side of the first die and the first pad structure is conductively coupled with the contact structure. An end of the contact structure protrudes from the insulating portion into the first pad structure. Further, in some embodiments, the semiconductor device includes a connection structure disposed on the back side of the first die and conductively connected with the semiconductor portion.

19 Claims, 6 Drawing Sheets

(56) References Cited

U.S. PATENT DOCUMENTS

| | | | |
|---|---|---|---|
| 2002/0063319 A1* | 5/2002 | Huang | H01L 23/13 |
| | | | 257/678 |
| 2017/0294377 A1* | 10/2017 | Dunga | H01L 23/5226 |
| 2019/0252209 A1* | 8/2019 | Chen | H01L 25/0657 |
| 2020/0227397 A1* | 7/2020 | Yada | H01L 25/0657 |
| 2020/0258816 A1* | 8/2020 | Okina | H01L 25/0657 |
| 2020/0286875 A1* | 9/2020 | Nishida | H01L 27/11573 |
| 2020/0303211 A1* | 9/2020 | Chen | H01L 25/50 |
| 2021/0035965 A1* | 2/2021 | Mizutani | H01L 25/18 |
| 2021/0225736 A1* | 7/2021 | Kim | H01L 24/45 |
| 2021/0265231 A1* | 8/2021 | Chang Chien | H01L 21/4882 |

* cited by examiner

PAD STRUCTURES FOR SEMICONDUCTOR DEVICES

RELATED APPLICATION

This application is a bypass continuation of International Application No. PCT/CN2020/112978, filed on Sep. 2, 2020. The entire disclosure of the prior application is hereby incorporated by reference in its entirety.

TECHNICAL FIELD

The present application describes embodiments generally related to semiconductor memory devices.

BACKGROUND

Generally, a semiconductor device (e.g., a semiconductor chip) communicates with the outside world through various input/output (I/O) pad structures, such as signaling pad structures, and power/ground (P/G) pad structures and the like. In some examples, a semiconductor chip can include multiple metal layers formed on top of circuitry above a substrate. One or more of the metal layers are used to form pad structures that are conductively coupled with the circuitry above the substrate. The pad structures can be formed to facilitate attachment of bonding wires that can conductively couple the pad structures with external components, such as power supply, ground, other semiconductor chips, metal lines on printed circuit board (PCB) and the like.

SUMMARY

Aspects of the disclosure provide a semiconductor device. The semiconductor device includes a first die and a second die boned face-to-face. The first die includes first transistors formed on a face side of the first die in a semiconductor portion and at least a contact structure disposed in an insulating portion outside the semiconductor portion. The second die includes a substrate and second transistors formed on a face side of the second die. Further, the semiconductor device includes a first pad structure disposed on a back side of the first die and the first pad structure is conductively coupled with the contact structure. An end of the contact structure protrudes from the insulating portion into the first pad structure. Further, in some embodiments, the semiconductor device includes a connection structure disposed on the back side of the first die and conductively connected with the semiconductor portion.

In an embodiment, an interface between the connection structure and the semiconductor portion is substantially flat over the semiconductor portion. In some examples, a bottom surface and a top surface of the connection structure on the semiconductor portion are about a same size.

In some embodiments, the contact structure includes at least a first metal material that is different from a second metal material in the first pad structure. In an example, the first metal material includes tungsten and the second metal material includes aluminum.

In some examples, due to the protrusion of the end of the contact structure, a bottom surface of the first pad structure that interfaces with the insulating portion has a concave portion corresponding to the end of the contact structure.

In some embodiments, the first die includes at least a memory cell array formed in the semiconductor portion, and the second die includes a periphery circuit for the memory cell array. The contact structure on the first die is electrically coupled to an input/output circuit on the second die via bonding structures.

In some embodiments, the first die includes an input/output circuit that is electrically coupled to the contact structure.

Aspects of the disclosure provide a method for fabricating a semiconductor device. The method includes bonding a first die and a second die face-to-face. The first die includes a first substrate, first transistors formed in a semiconductor portion on a face side of the first die, and a contact structure disposed in an insulating portion outside the semiconductor portion. The second die includes a second substrate with second transistors formed on a face side of the second. Further, the method includes removing the first substrate from a back side of the first die. The removing of the first substrate exposes an end of the contact structure on the back side of the first die. Then the method includes forming, on the back side of the first die, a first pad structure conductively connected with the contact structure. The end of the contact structure protrudes from the insulating portion inward the first pad structure.

In some embodiments, the method further includes forming, on the back side of the first die, a connection structure that is conductively connected with the semiconductor portion. In an embodiment, the removing of the first substrate exposes the semiconductor portion from the back side of the first die, and the method includes depositing layers for forming the connection structure. An interface of the layers to the semiconductor portion is substantially flat over the semiconductor portion. In some examples, the method includes patterning the layers to form the connection structure. A bottom surface and a top surface of the connection structure on the semiconductor portion are about a same size.

In some embodiments, the method includes depositing, on the contact structure that includes at least a first metal material, a second metal material that is different from the first metal material. The first pad structure includes at least the second metal material. The first metal material can be tungsten and the second metal material can be aluminum in an example.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide techniques for forming pad structures for a semiconductor device with two dies (e.g., a first die and a second die) bonded face-to-face. The pad structures are formed on a back side of one of the two dies, such as the first die. The techniques to form the pad structures do not need to form through silicon contacts (TSC) from the back side of the first die and simplify the processes to form the pad structures. In some embodiments, circuit components are formed on the face sides of the two dies. Additionally, at least a contact structure is formed in an insulating portion of the first die from the face side of the first die, and the contact structure is connected to an input/output (I/O) circuit. One of the pad structures on the back side of the first die, such as a first pad structure, is conductively coupled with the contact structure, and the contact structure includes an end that protrudes from the insulating portion inward the first pad structure. In some examples, the first die includes a semiconductor portion with transistors formed in the semiconductor portion. In some embodiments, a connection structure is formed with the pad structures, and is conductively coupled with the semiconductor portion. In an example, the connection structure is conductively coupled with the semiconductor portion without forming contact hole based contacts from the back side of the first die. The pad structures and the connection structure can be formed using same metal layer(s) in some examples.

According to some aspects of the disclosure, the semiconductor device can be a semiconductor memory device in which one of the two dies includes a memory cell array formed on the face side and is referred to as an array die and the other of the two dies includes periphery circuitry formed on the face side and is referred to as periphery die. In some examples, the periphery circuitry is formed using complementary metal-oxide-semiconductor (CMOS) technology, and the periphery die is also referred to as CMOS die. The pad structures and the connection structure can be formed on the back of the array die or can be formed on the back of the periphery die.

In some embodiments, the pad structures and the connection structure are formed on the back side of the array die. The array die includes a memory cell array formed in the semiconductor portion. Then, in an example, the connection structure that is conductively coupled with the semiconductor portion can be configured to provide a connection for an array common source (ACS) of the memory cell array.

According to some aspects of the disclosure, the two dies (e.g., the array die and the periphery die) are formed separately on two wafers. In some embodiments, a first wafer that includes array dies and a second wafer that includes periphery dies are formed separately. For example, the first wafer can be fabricated to optimize density and performance of the memory cell arrays without compromising to fabrication limitations due to the periphery circuitry; and the second wafer can be fabricated to optimize the performance of the periphery circuitry without compromising to fabrication limitations due to the memory cell array. In some embodiments, the first wafer and the second wafer can be bonded face to face using a wafer-to-wafer bonding technology, thus the array dies on the first wafer are respectively bonded with periphery dies on the second wafer. Then, the techniques provided in the present disclosure can be used to fabricate pad structures on a back side of one of the two wafers.

Figure 1:
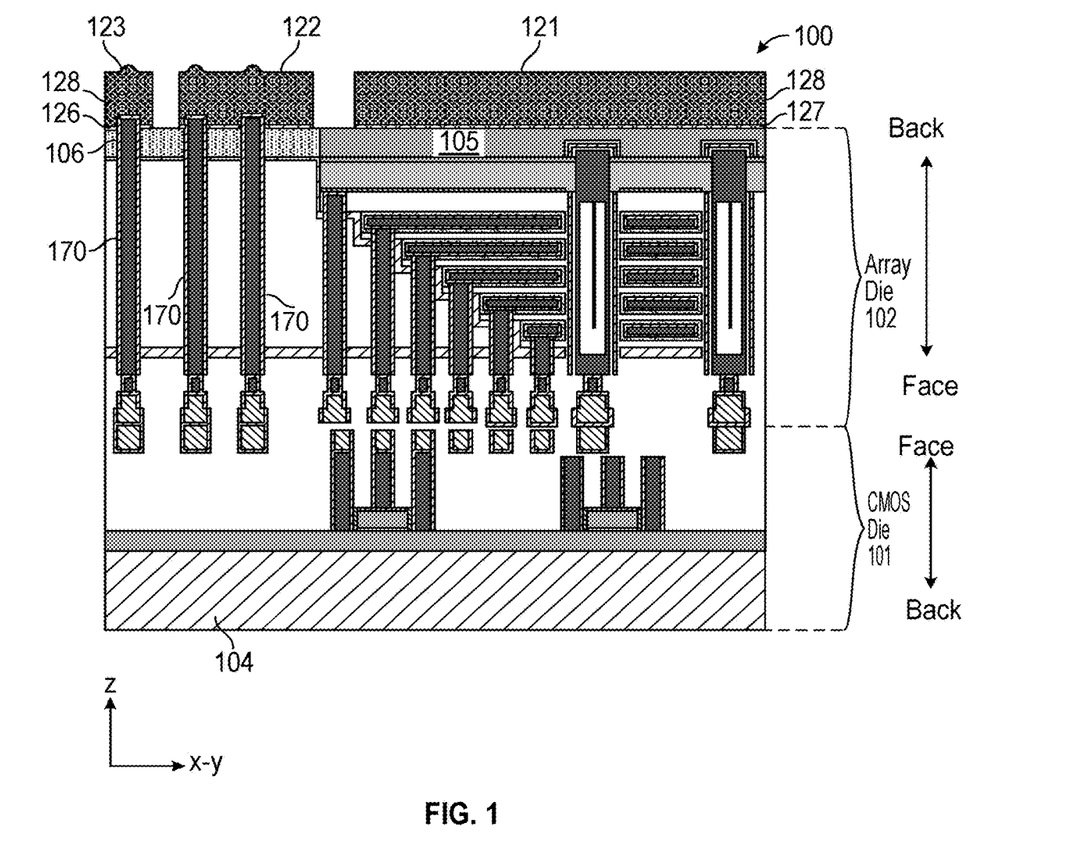
FIG. 1 shows a cross-sectional view of a semiconductor device according to some embodiments of the disclosure.

FIG. 1 shows a cross-sectional view of a semiconductor device, such as a semiconductor memory device 100, according to some embodiments of the disclosure. The semiconductor memory device 100 includes two dies that are bonded face to face. Pad structures and connection structures are formed on a back side of one of the two dies using the techniques provided in the present disclosure.

Specifically, in the FIG. 1 example, the semiconductor memory device 100 includes an array die 102 and a CMOS die 101 bonded face to face. It is noted that, in some embodiments, a semiconductor memory device can include multiple array dies and a CMOS die. The multiple array dies and the CMOS die can be stacked and bonded together. The CMOS die is respectively coupled to the multiple array dies, and can drive the respective array dies in a similar manner.

The semiconductor device 100 can be any suitable device. In some examples, the semiconductor device 100 includes at least a first wafer and a second wafer bonded face to face. The array die 102 is disposed with other array dies on the first wafer, and the CMOS die 101 is disposed with other CMOS dies on the second wafer. The first wafer and the second wafer are bonded together, thus the array dies on the first wafer are bonded with corresponding CMOS dies on the second wafer. In some examples, the semiconductor device 100 is a semiconductor chip with at least the array die 102 and the CMOS die 101 bonded together. In an example, the semiconductor chip is diced from wafers that are bonded together. In another example, the semiconductor device 100 is a semiconductor package that includes one or more semiconductor chips assembled on a package substrate.

The array die 102 includes one or more semiconductor portions 105, and insulating portions 106 between the semiconductor portions 105. The memory cell arrays can be formed in the semiconductor portions 105, the insulating portions can isolate the semiconductor portions 105 and provide space for contact structures 170. The CMOS die 101 includes a substrate 104, and peripheral circuitry formed on the substrate 104. For simplicity, the main surface (of the dies or wafers) is referred to as an X-Y plane, and the direction perpendicular to the main surface is referred to as Z direction.

Further, in the FIG. 1 example, connection structures 121 and pad structures 122-123 are formed on a back side of one of the two dies, such as the array die 102. Specifically, in the FIG. 1 example, the pad structures 122-123 are above the insulating portions 106 and each of the pad structures 122-123 can be conductively connected with one or more of the contact structures 170. In the FIG. 1 example, a connection structure 121 is above a semiconductor portion 105 and is conductively connected to the semiconductor portion 105. In some examples, the semiconductor portion 105 is coupled to an array common source (ACS) for a memory cell array, and the connection structure 121 is disposed over semiconductor portion(s) 105 for a block of memory cell arrays. In some example, the connection structure 121 is formed of metal layers of relatively low resistivity, and when the connection structure 121 covers a relatively large portion of the semiconductor portion 105, the connection structure 121 can connect the ACS of the block of the memory cell arrays with very small parasitic resistance. The connection structure 121 can include a portion that is configured as a pad structure for ACS to receive ACS signal from an external source. The pad structures 122-123 and the connection structure 121 are made of suitable metal material(s), such as aluminum, and the like that can facilitate attachment of bonding wires. In some examples, the pad structures 122-123 include a titanium layer 126 and an aluminum layer 128, and the connection structure 121 includes a titanium silicide layer 127 and the aluminum layer 128.

It is noted that, for ease of illustration, some components of the semiconductor memory device 100, such as passivation structures, and the like are not shown.

It is noted that the array die 102 initially includes a substrate and semiconductor portions 105 and the insulating portions 106 are formed on the substrate. The substrate is removed before the formation the pad structures 122-123 and the connection structure 121.

Figure 2:
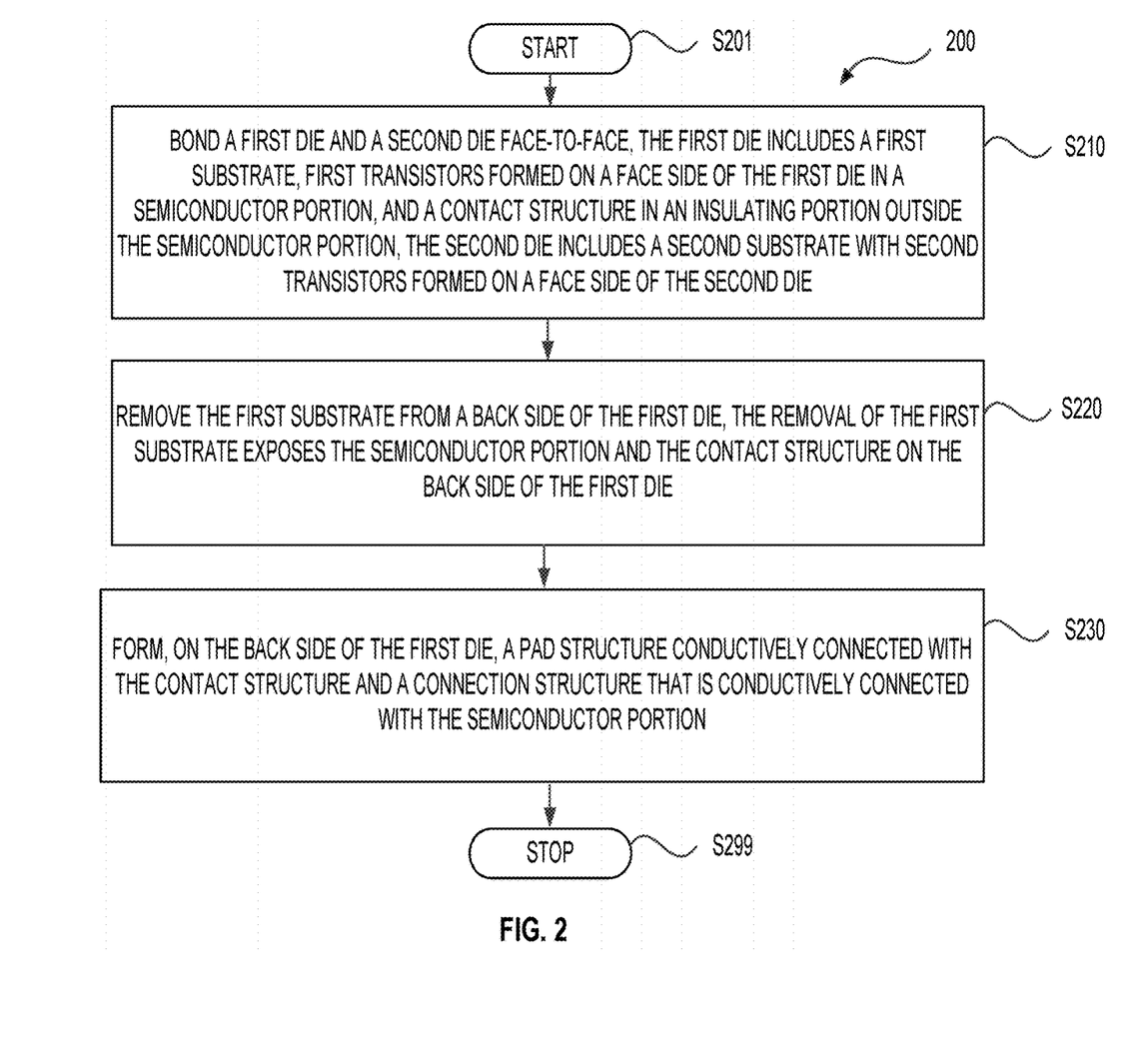
FIG. 2 shows a flow chart outlining a process for forming a semiconductor device.

FIG. 2 shows a flow chart outlining a process 200 for forming a semiconductor memory device, such as the semiconductor memory device 100 according to some embodiments of the disclosure, and FIGS. 3-6 show cross-sectional views of the semiconductor device 100 during the process in accordance with some embodiments. The process 200 starts from S201 and proceeds to S210.

At S210, a first die and a second die are bonded face to face. The first die includes a first substrate, and includes semiconductor portions and insulating portions disposed on the first substrate on the face side. The insulating portions can insulate the semiconductor portions. The first die also includes first transistors formed in the semiconductor portions from the face side of the first die. Further, the first die includes contact structures disposed in the insulating portions that are outside the semiconductor portions. The insulating portions can also insulate the contact structures from each other and from the semiconductor portions. The second die includes a second substrate with second transistors formed on a face side of the second die.

In some embodiments, the first die is an array die, such as the array die 102 and the second die is a CMOS die, such as the CMOS die 101. In some examples, the first die can be a CMOS die and the second die can be an array die.

Figure 3:
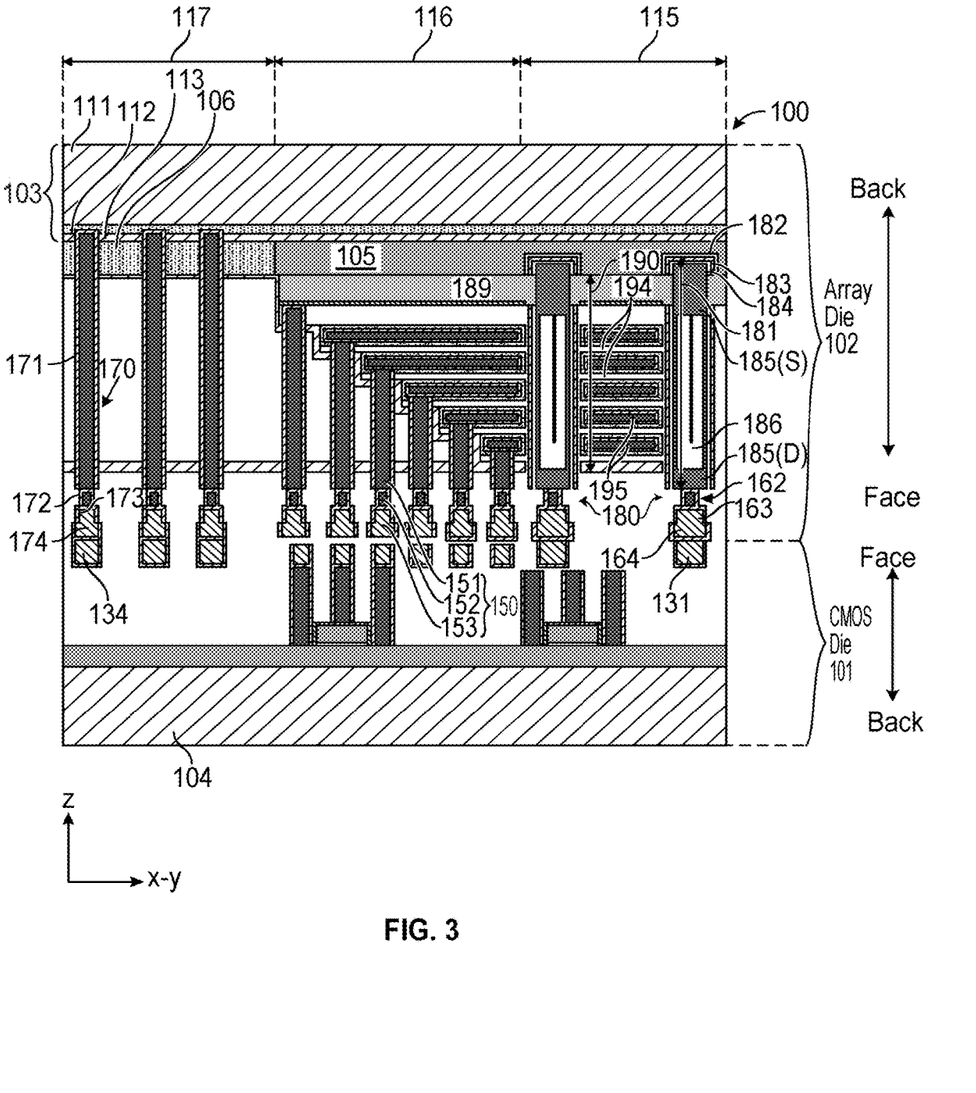
FIGS. 3-6 show cross-sectional views of a semiconductor device during a fabrication process in accordance with some embodiments.

FIG. 3 shows a cross-sectional view of the semiconductor memory device 100 after a bonding process of two dies. The semiconductor memory device 100 includes the array die 102 and the CMOS die 101 that are bonded face to face.

In some embodiments, the array die 102 is fabricated with other array dies on a first wafer, and the CMOS die 101 is fabricated with other CMOS dies on a second wafer. In some examples, the first wafer and the second wafer are fabricated separately. For examples, memory cell arrays and I/O contact structures are formed on the first wafer using processes that operate on the face side of the first wafer. Further, first bonding structures are formed on the face side of the first wafer. Similarly, periphery circuitry is formed on the second wafer using processes that operate on the face side of the second wafer, and second bonding structures are formed on the face side of the second wafer.

In some embodiments, the first wafer and the second wafer can be bonded face to face using a wafer-to-wafer bonding technology. The first bonding structures on the first wafer are bonded with corresponding second bonding structures on the second wafer, thus the array dies on the first wafer are respectively bonded with the CMOS dies on the second wafer.

The array die 102 includes a substrate 103. On the substrate 103, one or more semiconductor portions 105 and insulating portions 106 are formed. The insulating portions 106 are formed of insulating material, such as silicon oxide and the like that can insulate the semiconductor portions 105. Further, memory cell arrays can be formed in the semiconductor portions 105 and contact structures can be formed in the insulating portions 106. The CMOS die 101 includes a substrate 104, and includes peripheral circuitry formed on the substrate 104.

The substrate 103 and the substrate 104 respectively can be any suitable substrate, such as a silicon (Si) substrate, a germanium (Ge) substrate, a silicon-germanium (SiGe) substrate, and/or a silicon-on-insulator (SOI) substrate. The substrate 103 and the substrate 104 respectively may include a semiconductor material, for example, a Group IV semiconductor, a Group III-V compound semiconductor, or a Group II-VI oxide semiconductor. The Group IV semiconductor may include Si, Ge, or SiGe. The substrate 103 and the substrate 104 respectively may be a bulk wafer or an epitaxial layer. In some examples, a substrate is formed of multiple layers. For example, the substrate 103 includes multiple layers, such as a bulk portion 111, a silicon oxide layer 112 and a silicon nitride layer 113, as shown in FIG. 3.

In the FIG. 3 example, the memory cell arrays are formed on the substrate 103 of the array die 102 and the peripheral circuitry is formed on the substrate 104 of the CMOS die 101. The array die 102 and the CMOS die 101 are disposed face to face (the surface with circuitry disposed on is referred to as face, and the opposite surface is referred to as back), and bonded together.

In some examples, a semiconductor portion 105 is formed on the substrate 103, and a block of three dimensional (3D) NAND memory cell strings can be formed in the semiconductor portion 105. The semiconductor portion 105 is conductively coupled with an array common source of the memory cell strings. In some examples, a memory cell array is formed in a core region 115 as an array of vertical memory cell strings. Besides the core region 115, the array die 102 includes a staircase region 116 and an insulating region 117. The staircase region 116 is used to facilitate making connections to, for example, gates of the memory cells in the vertical memory cell strings, gates of the select transistors, and the like. The gates of the memory cells in the vertical memory cell strings correspond to word lines for the NAND memory architecture. The insulating region 117 is used to form the insulating portion 106.

In the FIG. 3 example, vertical memory cell strings 180 are shown as representation of an array of vertical memory cell strings formed in the core region 115. The vertical memory cell strings 180 are formed in a stack of layers 190. The stack of layers 190 includes gate layers 195 and insulating layers 194 that are stacked alternatingly. The gate layers 195 and the insulating layers 194 are configured to form transistors that are stacked vertically. In some examples, the stack of transistors includes memory cells and select transistors, such as one or more bottom select transistors, one or more top select transistors and the like. In some examples, the stack of transistors can include one or more dummy select transistors. The gate layers 195 correspond to gates of the transistors. The gate layers 195 are made of gate stack materials, such as high dielectric constant (high-k) gate insulator layers, metal gate (MG) electrode, and the like. The insulating layers 194 are made of insulating material(s), such as silicon nitride, silicon dioxide, and the like.

According to some aspects of the disclosure, the vertical memory cell strings are formed of channel structures 181 that extend vertically (Z direction) into the stack of layers 190. The channel structures 181 can be disposed separate from each other in the X-Y plane. In some embodiments, the channel structures 181 are disposed in the form of arrays between gate line cut structures (not shown). The gate line cut structures are used to facilitate replacement of sacrificial layers with the gate layers 195 in a gate-last process. The arrays of the channel structures 181 can have any suitable array shape, such as a matrix array shape along the X direction and the Y direction, a zig-zag array shape along the X or Y direction, a beehive (e.g., hexagonal) array shape, and the like. In some embodiments, each of the channel structures has a circular shape in the X-Y plane, and a pillar shape in the X-Z plane and Y-Z plane. In some embodiments, the quantity and arrangement of the channel structures between gate line cut structures is not limited.

In some embodiments, the channel structure 181 has a pillar shape that extends in the Z direction that is perpendicular to the direction of the main surface of the substrate 103. In an embodiment, the channel structure 181 is formed by materials in the circular shape in the X-Y plane, and extends in the Z direction. For example, the channel structure 181 includes function layers, such as a blocking insulating layer 182 (e.g., silicon oxide), a charge storage layer (e.g., silicon nitride) 183, a tunneling insulating layer 184 (e.g., silicon oxide), a semiconductor layer 185, and an insulating layer 186 that have the circular shape in the X-Y plane, and extend in the Z direction. In an example, the blocking insulating layer 182 (e.g., silicon oxide) is formed on the sidewall of a hole (into the stack of layers 190) for the channel structure 181, and then the charge storage layer (e.g., silicon nitride) 183, the tunneling insulating layer 184, the semiconductor layer 185, and the insulating layer 186 are sequentially stacked from the sidewall. The semiconductor layer 185 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 186 is formed of an insulating material, such as silicon oxide and/or silicon nitride, and/or may be formed as an air gap.

According to some aspects of the disclosure, the channel structure 181 and the stack of layers 190 together form the memory cell string 180. For example, the semiconductor layer 185 corresponds to the channel portions for transistors in the memory cell string 180, and the gate layers 195 corresponds to the gates of the transistors in the memory cells string 180. Generally, a transistor has a gate that controls a channel, and has a drain and a source at each side of the channel. For simplicity, in the FIG. 3 example, the bottom side of the channel for transistors in FIG. 3 is referred to as the drain, and the upper side of the channel for transistors in FIG. 3 is referred to as the source. It is noted that the drain and the source can be switched under certain driving configurations. In the FIG. 3 example, the semiconductor layer 185 corresponds to connected channels of the transistors. For a specific transistor, the drain of the specific transistor is connected with a source of a lower transistor below the specific transistor, and the source of the specific transistor is connected with a drain of an upper transistor above the specific transistor in the FIG. 3 example. Thus, the transistors in the memory cell string 180 are connected in series. It is noted that "upper" and "lower" are used specific to FIG. 3 where the array die 102 is disposed upside down.

The memory cell string 180 includes memory cell transistors (or referred to as memory cells). A memory cell transistor can have different threshold voltages based on carrier trappings in a portion of the charge storage layer 183 that corresponds to a floating gate for the memory cell transistor. For example, when a significant amount of holes are trapped (stored) in the floating gate of the memory cell transistor, the threshold voltage of the memory cell transistor is lower than a predefined value, then the memory cell transistor is in a un-programed state (also referred to as erased state) corresponding to logic "1". When holes are expelled from the floating gate, the threshold voltage of the memory cell transistor is above a predefined value, thus the memory cell transistor is in a programed state corresponding to logic "0" in some examples.

The memory cell string 180 includes one or more top select transistors configured to couple/de-couple the memory cells in the memory cell string 180 to a bit line, and includes one or more bottom select transistors configured to couple/de-couple the memory cells in the memory cell string 180 to the ACS.

The top select transistors are controlled by top select gates (TSG). For example, when a TSG voltage (voltage applied to the TSG) is larger than a threshold voltage of the top select transistors, the top select transistors in the memory cell string 180 are turned on and the memory cells in the memory cell string 180 are coupled to the bit line (e.g., drain of the string of memory cells is coupled to the bit line); and when the TSG voltage (voltage applied to the TSG) is smaller than the threshold voltage of the top select transistors, the top select transistors are turned off and the memory cells in the memory cell string 180 are de-coupled from the bit line (e.g., drain of the string of memory cells is decoupled from the bit line).

Similarly, the bottom select transistors are controlled by bottom select gates (BSG). For example, when a BSG voltage (voltage applied to the BSG) is larger than a threshold voltage of the bottom select transistors in a memory cell string 180, the bottom select transistors are turned on and the memory cells in the memory cell string 180 are coupled to the ACS (e.g., source of the string of memory cells in the memory cell string 180 is coupled to the ACS); and when the BSG voltage (voltage applied to the BSG) is smaller than the threshold voltage of the bottom select transistors, the bottom select transistors are turned off and the memory cells are de-coupled from the ACS (e.g., source of the string of memory cells in the memory cell string 180 is de-coupled from the ACS).

Shown in FIG. 3, the upper portion of the semiconductor layer 185 in the channel hole corresponds to a source side of the vertical memory cell string 180, and the upper portion is labeled as 185(S). In the FIG. 3 example, a common source layer 189 is formed in conductive connection with the source of the vertical memory cell string 180. The common source layer 189 can includes one or more layers. In some examples, the common source layer 189 includes silicon material, such as intrinsic polysilicon, doped polysilicon (such as N-type doped silicon, P-type doped silicon and the like) and the like. In some examples, the common source layer 189 may include metal silicide to improve conductivity. The common source layer 189 is similarly in conductive connection with sources of other vertical memory cell strings (not shown) in the semiconductor portion 105, and thus forms an array common source (ACS).

According to some aspects of the disclosure, the semiconductor portion 105 and the common source layer 189 are conductively coupled in some examples, thus the semiconductor portion 105 can be configured as the array common source for the vertical memory cell strings formed in the semiconductor portion 105.

In the FIG. 3 example, in the channel structure 181, the semiconductor layer 185 extends vertically from the source side of the channel structure 181 down, and forms a bottom portion corresponds to a drain side of the vertical memory cell string 180. The bottom portion of the semiconductor layer 185 is labeled as 185(D). It is noted that drain side and the source side are named for the ease of description. The drain side and the source side may function differently from the names.

In the FIG. 3 example, interconnection structures, such as a via 162, a metal wire 163, a bonding structure 164, and the like, can be formed to electrically couple the bottom portion of the semiconductor layer 185(D) to a bit line (BL).

Further in FIG. 3 example, the staircase region 116 includes a staircase that is formed to facilitate word line connections to the gates of transistors (e.g., memory cells, top select transistor(s), bottom select transistor(s) and the like). For example, a word line connection structure 150 includes a word line contact plug 151, a via structure 152, and metal wire 153 that are conductively coupled together. The word line connection structure 150 can electrically couple a WL to a gate terminal of a transistor in the memory cell string 180.

In the FIG. 3 example, the contact structures 170 are formed in the insulating region 117. In some embodiments, the contact structures 170 can be formed at the same time as the word line connection structures 150 by processing on the face side of the array die 102. Thus, in some examples, the contact structures 170 have similar structures as the word line connection structures 150. Specifically, a contact structure 170 can include a contact plug 171, a via structure 172, and metal wire 173 that are conductively coupled together.

In some examples, a mask that includes patterns for the contact plugs 171 and the word line contact plugs 151 can be used. The mask is used to form contact holes for the contact plugs 171 and the word line contact plugs 151. Etch process can be used to form the contact holes. In an example, etching of the contact holes for the word line contact plugs 151 can stop on the gate layers 195 and the etching of the contact holes for the contact plugs 171 can stop in the oxide layer 112. Further, the contact holes can be filled with suitable liner layer (e.g., titanium/titanium nitride) and a metal layer (e.g., tungsten) to form the contact plugs, such as the contact plugs 171 and the word line contact plugs 151. Further back end of line (BEOL) processes are used to form various connection structures, such via structures, metal wires, bonding structures, and the like.

Further, in the FIG. 3 examples, bonding structures are respectively formed on the face sides of the array die 102 and the CMOS die 101. For example, bonding structures 174 and 164 are formed on face side of the array die 102, and bonding structures 131 and 134 are formed on the face side of the CMOS die 101.

In the FIG. 3 example, the array die 102 and the CMOS die 101 are disposed face-to-face (circuitry side is face, and the substrate side is back) and bonded together. Corresponding bonding structures on the array die 102 and the CMOS die 101 are aligned and bonded together, and form a bonding interface that conductively couple suitable components on the two dies. For example, the bonding structure 164 and the bonding structure 131 are bonded together to couple the drain side of the memory cell string 180 with a bit line (BL). In another example, the bonding structure 174 and the bonding structure 134 are bonded together to couple a contact structure 170 on the array die 102 with an I/O circuit on the CMOS die 101.

Referring back to S220, the first substrate of the first die is removed from the back side of the first die. The removal of the first substrate exposes the semiconductor portion and the contact structures 170 on the back side of the first die.

Figure 4:
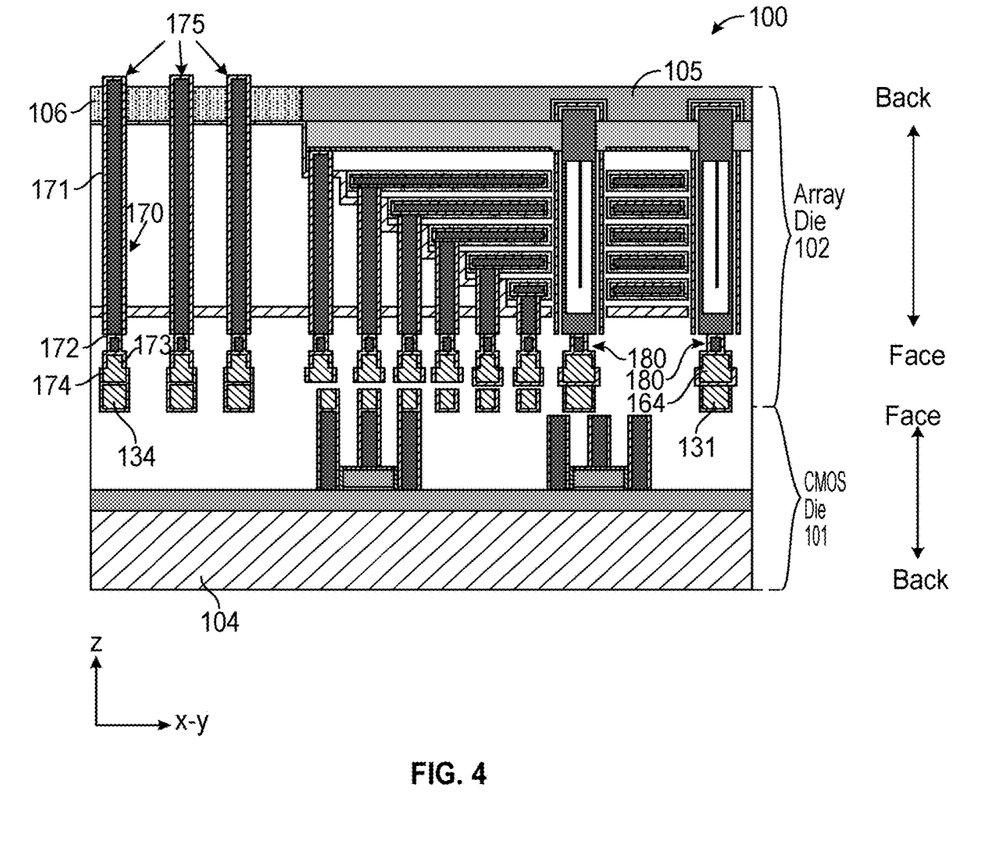

FIG. 4 shows a cross-sectional view of the semiconductor memory device 100 after the removal of the first substrate 103 from the array die 102. In the FIG. 4 example, the bulk portion 111, the silicon oxide layer 112 and the silicon nitride layer 113 are removed from the back side of the array die 102. In some examples, after a wafer-to-wafer bonding process, a first wafer with array dies is bonded with a second wafer with CMOS dies. Then, the first substrate is thinned from the back side of the first wafer. In an example, a chemical mechanical polishing (CMP) process or a grind process is used to remove a majority portion of the bulk portion 111 of the first wafer. Further, suitable etch process can be used to remove remaining bulk portion 111, the silicon oxide layer 112 and the silicon nitride layer 113 from the back side of the first wafer. The removal of the bulk portion 111, the silicon oxide layer 112 and the silicon nitride layer 113 can reveal the ends (as shown by 175) of the contact structures 170 that protrude from the insulating portions 106. The removal of the bulk portion 111, the silicon oxide layer 112 and the silicon nitride layer 113 can also reveal the semiconductor portion 105.

Referring back to FIG. 2, at S230, at the back side of the first die, pad structures and connection structures are formed. In some embodiments, the pad structures include first pad structures that are conductively connected with the contact structures 170. The connection structures are conductively connected with semiconductor portions 150.

In some embodiments, the pad structures and the connection structures are mainly formed of aluminum (Al). In some embodiments, interfacing layer(s) can be formed between the aluminum and the semiconductor portion 105. In some examples, metal silicide thin films can be used as the interfacing layer(s). In an example, a metal silicide thin film can be used to enable ohmic contacts between the aluminum and the semiconductor portion 105. In another example, a metal silicide thin film is used to form local interconnects to the semiconductor portion 105. In another example, a metal silicide thin film is used as diffusion barriers to prevent aluminum diffusion into the semiconductor portion 105.

In some examples, titanium is deposited overall on the back side of the first wafer that is face-to-face bonded with the second wafer, and is then heated in a nitrogen atmosphere. The titanium can react with exposed silicon surfaces (such as the semiconductor portion 105) to form titanium silicide. The portions (e.g., above the insulating portions, above the ends of the contact structures 170 and the like) of titanium which did not react to form silicide.

Figure 5:
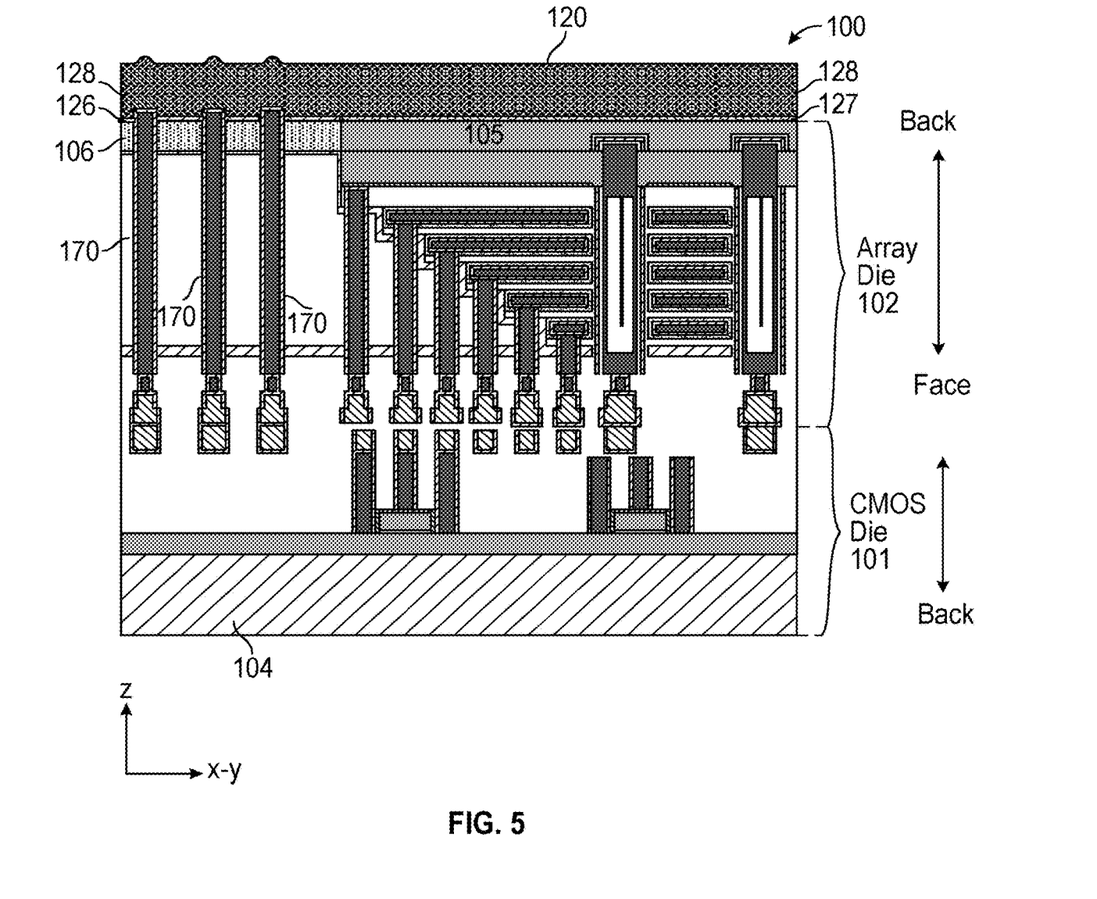

Then, metal film(s) can be formed on the surface of the back side of the first wafer. FIG. 5 shows a cross-sectional view of the semiconductor memory device 100 after the deposition of metal film(s). In the FIG. 5 example, a metal film 120 is deposited on the back side of the first wafer. The metal film 120 may have uneven surface due to the protrusion by the ends of the contact structures 170. In some embodiments, the metal film 120 includes a titanium layer 126 and an aluminum layer 128. In an embodiment, the titanium layer 126 on the semiconductor portion 105 can react with silicon surface to form titanium silicide 127. For example, the titanium layer 126 is deposited and heated in nitrogen atmosphere. Then the aluminum layer 128 is deposited.

Figure 6:
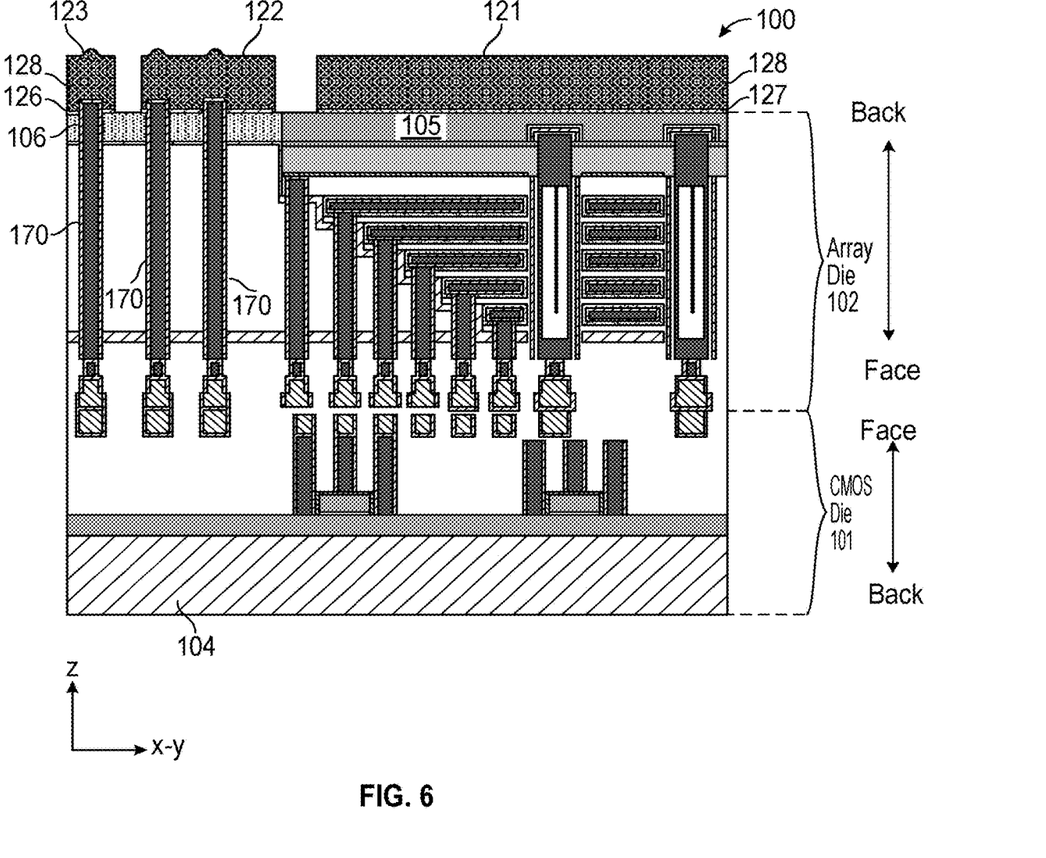

The metal film 120 can be patterned to form pad structures and connection structures. FIG. 6 shows a cross-sectional view of the semiconductor memory device 100 after the metal film 120 is patterned into pad structures 122-123 and connection structure 121. In the FIG. 6 example, the pad structures 122-123 are respectively connected to the contact structures 170 and are disposed above the insulating portions 106; the connection structure 121 is connected to the semiconductor portion 105. In some embodiments, a photolithography process is used to define patterns for the pad structures 122-123 and the connection structure 121 into a photoresist layer according to a mask, then an etch process is used to transfer the patterns into the metal film 120 and to from the pad structures 122-123 and the connection structure 121.

According to an aspect of the disclosure, films of the connection structure 121 are directly deposited on the semiconductor portion 105, thus an interface between the connection structure 121 and the semiconductor portion 105 is substantially flat over the semiconductor portion 105. In a related example, the semiconductor portion 105 can be covered by an insulating layer, contact holes are formed in the insulating layer, then suitable metal layers are deposited (into the holes and over the insulating layer) to form contacts and connections. Comparing to the related example, the connection structure 121 is formed without using contact holes in insulating layers, and the interface between the connection structure 121 and the semiconductor portion 105 relatively flat, the bottom surface and the top surface of the connection structure 121 on the semiconductor portion 105 are about the same when etch profile related difference is ignored.

According to another aspect of the disclosure, due to the protrusion of the ends of the contact structures 170, the metal film 120 may have uneven surface. For example, the bottom surface of the metal film 120 that interfaces with the insulating portion 106 may have concave portions corresponding to the ends of the contact structures 170, thus the bottom surface of the pad structures 122-123 may have concave portions corresponding to the ends of the contact structures 170.

The wafer fabrication process can continue further processes, such as, passivation, testing, dicing and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first die and a second die bonded face-to-face, the first die comprising first transistors formed on a face side of the first die in a semiconductor portion and at least a contact structure disposed in an insulating portion outside the semiconductor portion, the second die comprising a substrate and second transistors formed on a face side of the second die;
   a first pad structure disposed on a back side of the first die and conductively coupled with the contact structure, an end of the contact structure protruding from the insulating portion into the first pad structure; and
   a connection structure disposed on a portion of the back side of the first die that corresponds to the entire semiconductor portion and conductively connected with the semiconductor portion.

2. The semiconductor device of claim 1, wherein an interface between the connection structure and the semiconductor portion is substantially flat over the semiconductor portion.

3. The semiconductor device of claim 1, wherein a bottom surface and a top surface of the connection structure on the semiconductor portion are about a same size.

4. The semiconductor device of claim 1, wherein the contact structure includes at least a first metal material that is different from a second metal material in the first pad structure.

5. The semiconductor device of claim 4, wherein the first metal material comprises tungsten and the second metal material comprises aluminum.

6. The semiconductor device of claim 1, wherein the first die comprises at least a memory cell array formed in the semiconductor portion, the second die comprises a periphery circuit for the memory cell array.

7. The semiconductor device of claim 6, wherein the contact structure on the first die is electrically coupled to an input/output circuit on the second die via bonding structures.

8. The semiconductor device of claim 1, wherein the first die comprises an input/output circuit that is electrically coupled to the contact structure.

9. A semiconductor device, comprising:
   a first die and a second die bonded face-to-face, the first die comprising first transistors formed on a face side of the first die in a semiconductor portion and at least a contact structure disposed in an insulating portion outside the semiconductor portion, the second die comprising a substrate and second transistors formed on a face side of the second die; and
   a first pad structure disposed on a back side of the first die and conductively coupled with the contact structure, an end of the contact structure protruding from the insulating portion into the first pad structure,
   wherein a bottom surface of the first pad structure that interfaces with the insulating portion has a concave portion corresponding to the end of the contact structure.

10. A method for fabricating a semiconductor device, comprising:
    bonding a first die and a second die face-to-face, the first die comprising a first substrate, first transistors formed in a semiconductor portion on a face side of the first substrate, and a contact structure disposed in an insulating portion outside the semiconductor portion, the second die comprising a second substrate with second transistors formed on a face side of the second substrate removing the first substrate from a back side of the first die, the removing of the first substrate exposing an end of the contact structure on the back side of the first die; and forming, on the back side of the first die, a first pad structure conductively connected with the contact structure, the end of the contact structure protruding from the insulating portion inward the first pad structure.

11. The method of claim 10, further comprising:
forming, on the back side of the first die, a connection structure that is conductively connected with the semiconductor portion.

12. The method of claim 11, wherein the removing of the first substrate exposes the semiconductor portion from the back side of the first die, and the method comprises:
depositing layers for forming the connection structure, an interface of the layers to the semiconductor portion being substantially flat over the semiconductor portion.

13. The method of claim 12, further comprising:
patterning the layers to form the connection structure with a bottom surface and a top surface of the connection structure on the semiconductor portion being about a same size.

14. The method of claim 10, wherein further comprising:
depositing, on the contact structure that comprises at least a first metal material, a second metal material that is different from the first metal material, the first pad structure comprising at least the second metal material.

15. The method of claim 14, wherein the first metal material comprises tungsten and the second metal material comprises aluminum.

16. The method of claim 10, wherein forming the first pad structure further comprises:
depositing one or more layers for forming the first pad structure on the insulating portion with the end of the contact structure protruding from the insulating portion, a bottom surface of the one or more layers that interfaces with the insulating portion having a concave portion corresponding to the end of the contact structure.

17. The method of claim 10, wherein the first die comprises at least a memory cell array formed in the semiconductor portion, the second die comprises a periphery circuit for the memory cell array.

18. The method of claim 17, wherein bonding the first die and the second die face-to-face further comprises:
bonding a first bonding structure on the first die with a second bonding structure on the second die, the first bonding structure being conductively coupled with the contact structure on the first die and the second bonding structure being conductively coupled with an input/output circuit on the second die.

19. The method of claim 10, wherein the first die comprises an input/output circuit that is electrically coupled to the contact structure.

\* \* \* \* \*